United States Patent
Murakami et al.

(10) Patent No.: US 11,667,531 B2
(45) Date of Patent: Jun. 6, 2023

(54) THERMAL INTERFACE MATERIAL, METHOD FOR THERMALLY COUPLING WITH THERMAL INTERFACE MATERIAL, AND METHOD FOR PREPARING THERMAL INTERFACE MATERIAL

(71) Applicant: KANEKA CORPORATION, Osaka (JP)

(72) Inventors: Mutsuaki Murakami, Osaka (JP); Atsushi Tatami, Osaka (JP); Masamitsu Tachibana, Osaka (JP)

(73) Assignee: KANEKA CORPORATION, Osaka (JP)

( * ) Notice: Subject to any disclaimer, the term of this patent is extended or adjusted under 35 U.S.C. 154(b) by 976 days.

(21) Appl. No.: 16/483,386

(22) PCT Filed: Jan. 30, 2018

(86) PCT No.: PCT/JP2018/002955
§ 371 (c)(1),
(2) Date: Aug. 2, 2019

(87) PCT Pub. No.: WO2018/143188
PCT Pub. Date: Aug. 9, 2018

(65) Prior Publication Data
US 2020/0024144 A1    Jan. 23, 2020

(30) Foreign Application Priority Data
Feb. 2, 2017    (JP) .............................. JP2017-017693

(51) Int. Cl.
*C01B 32/205* (2017.01)
*C09J 7/20* (2018.01)
(Continued)

(52) U.S. Cl.
CPC ............... *C01B 32/205* (2017.08); *C09J 7/20* (2018.01); *C09J 201/00* (2013.01); *H01L 23/373* (2013.01); *C09J 2203/326* (2013.01)

(58) Field of Classification Search
CPC ....... B32B 9/007; C01B 32/20; C01B 32/205; C01B 32/21
See application file for complete search history.

(56) References Cited

U.S. PATENT DOCUMENTS

2016/0249453 A1* 8/2016 Tatami .................. C01B 32/205
2017/0355603 A1   12/2017 Tachibana et al.

FOREIGN PATENT DOCUMENTS

JP    2009132602 A    6/2009
JP    2010001191 A    1/2010
(Continued)

OTHER PUBLICATIONS

Machine Translation of JP 2010-064949 (Year: 2010).*
(Continued)

*Primary Examiner* — Zachary M Davis
(74) *Attorney, Agent, or Firm* — Osha Bergman Watanabe & Burton LLP

(57) ABSTRACT

A thermal interface material for transferring heat by interposing between two materials may include a graphite film. The graphite film may have a thickness of 1 μm to 50 μm, a density of 1.40 g/cm³ to 2.26 g/cm³, a thermal conductivity of 500 W/mK to 2000 W/mK in a film plane direction, and an arithmetic average roughness Ra of 0.1 μm to 10 μm on a surface of the graphite film.

22 Claims, 8 Drawing Sheets

(51) Int. Cl.
*C09J 201/00* (2006.01)
*H01L 23/373* (2006.01)

(56) References Cited

FOREIGN PATENT DOCUMENTS

| JP | 2010064949 A | * | 3/2010 | ............ C01B 32/20 |
| JP | 2014133669 A | | 7/2014 | |
| JP | 2017071528 A | | 4/2017 | |
| WO | WO-2015045641 A1 | * | 4/2015 | ............ B32B 27/20 |
| WO | 2016/129442 A1 | | 8/2016 | |

OTHER PUBLICATIONS

Extended European Search Report issued in corresponding European Application No. 18748781.4 dated Oct. 16, 2020 (7 pages).
International Search Report issued in International Application No. PCT/JP2018/002955, dated Apr. 24, 2018 (1 page).
Written Opinion issued in International Application No. PCT/JP2018/002955, dated Apr. 24, 2018 (10 pages).

* cited by examiner

[Fig. 1]
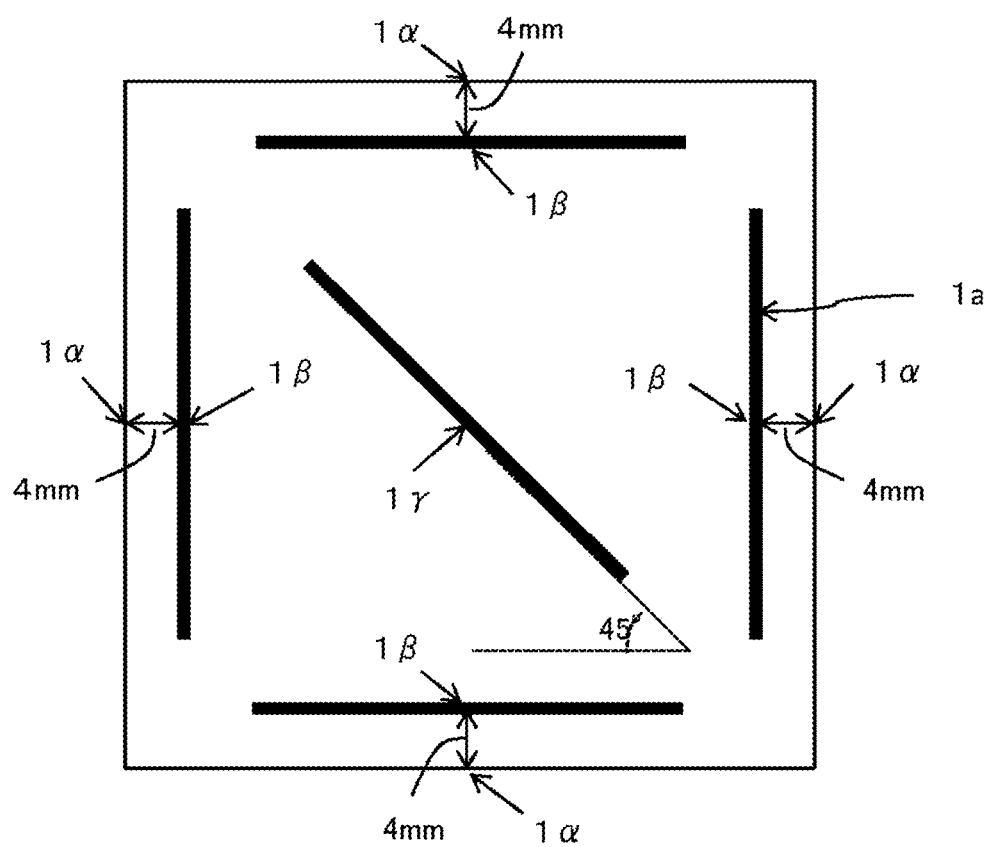

[Fig. 2]
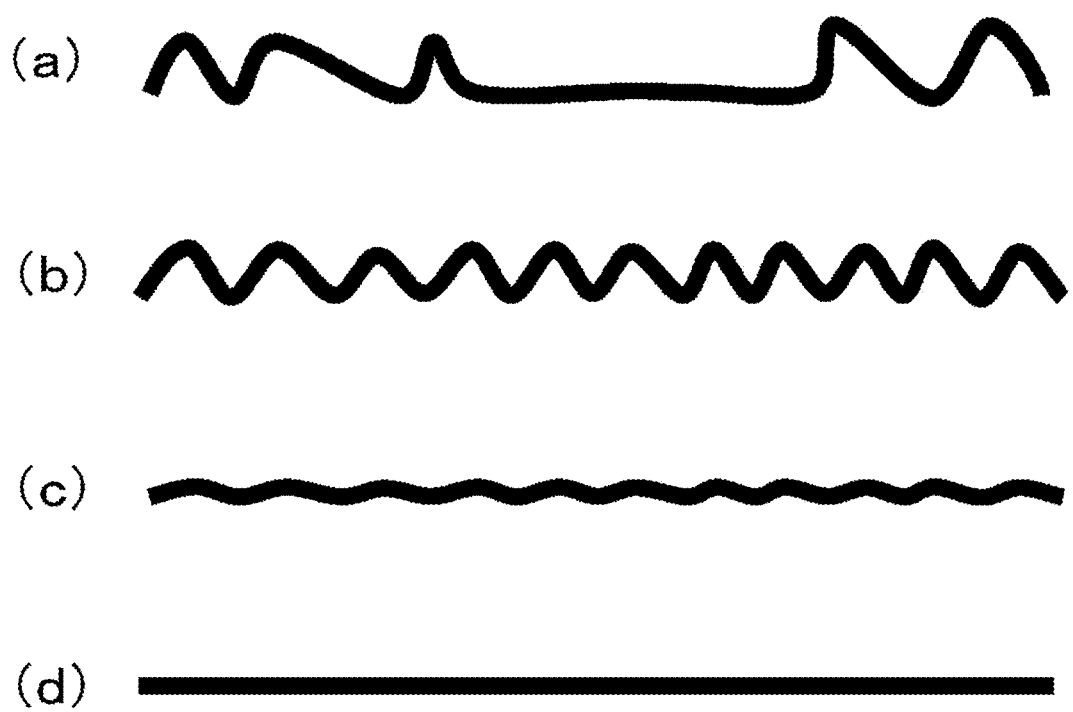

[Fig. 3]
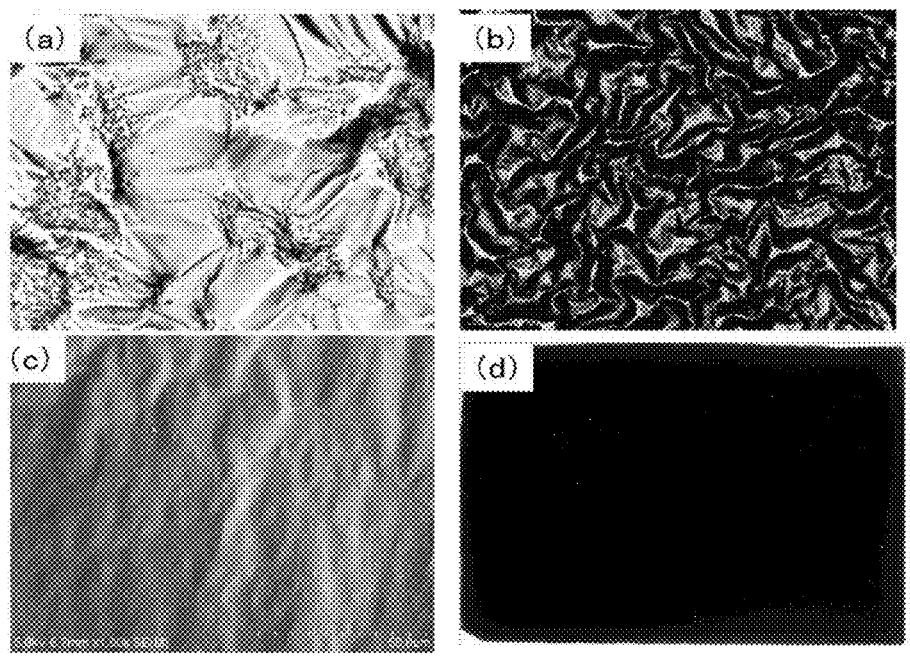

[Fig. 4]
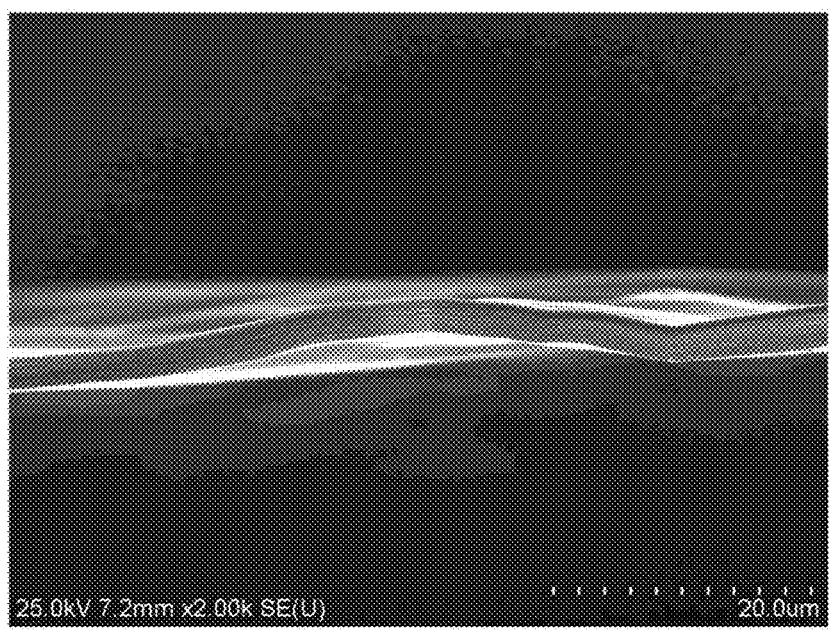

[Fig. 5]
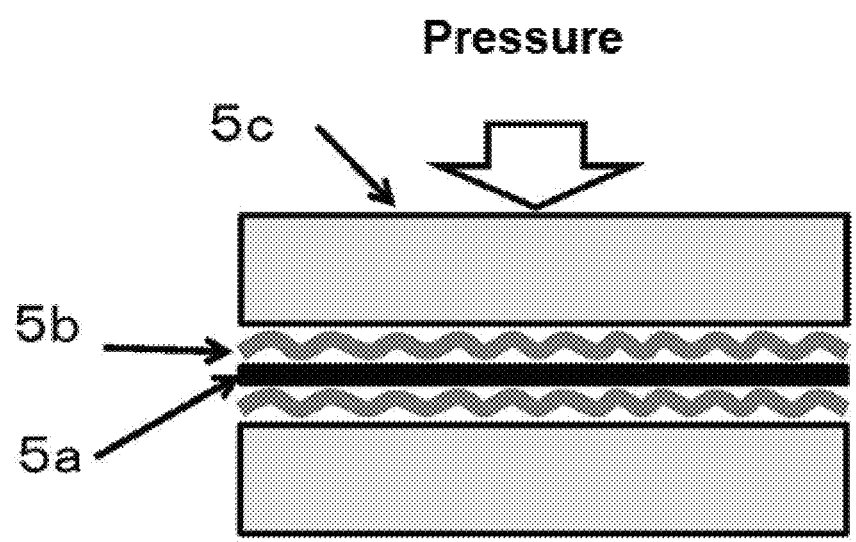

[Fig. 6]
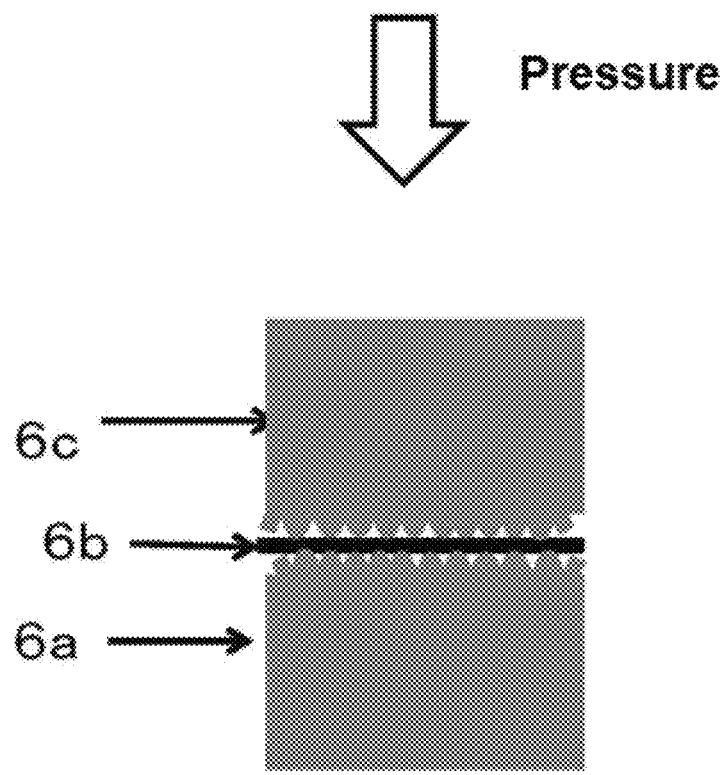

[Fig. 7]
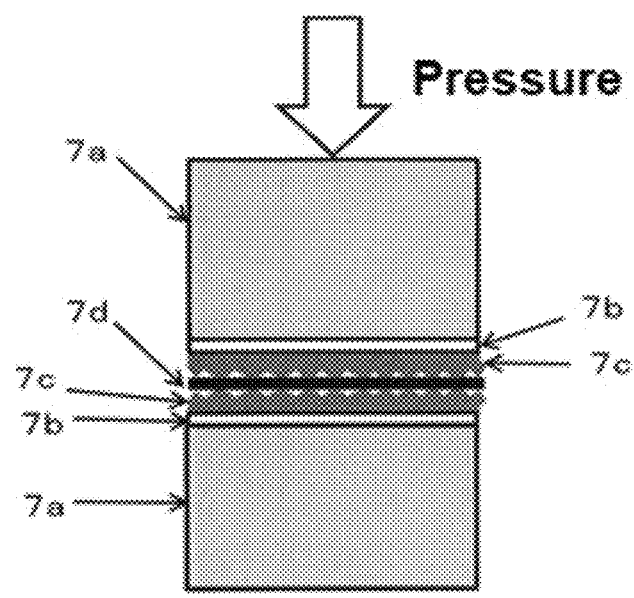

[Fig. 8]
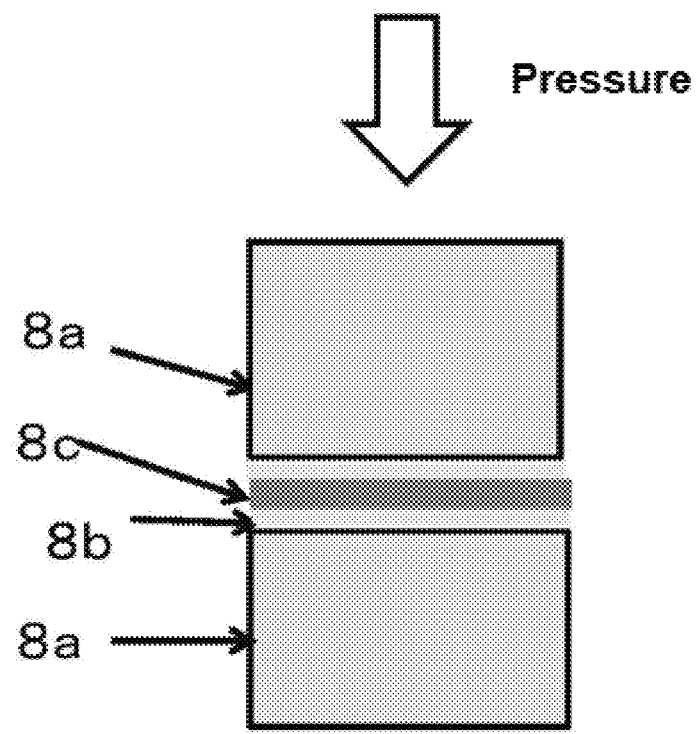

THERMAL INTERFACE MATERIAL, METHOD FOR THERMALLY COUPLING WITH THERMAL INTERFACE MATERIAL, AND METHOD FOR PREPARING THERMAL INTERFACE MATERIAL

TECHNICAL FIELD

The present invention relates to a thermal interface material for rapidly transferring heat from a heat generation source to a cooling material or a heat radiating material, a method for thermally coupling with the thermal interface material, and a method for preparing the thermal interface material.

BACKGROUND ART

In recent years, the heat generation amount has increased according to the higher speed of microprocessors or higher performance of LED (Light Emitting Diode) chips, and heat in electronic devices such as a portable phone, a personal computer, a PDA (Personal Digital Assistant), and a game apparatus as well as in LED illumination is great problems to be solved. For heat dissipation and cooling, there are many methods such as thermal conductions, thermal radiations, or heat convections. A heat sink and an air-cooling fan are used for the heat convections. A ceramic plate is used for the thermal radiations. Various kinds of thermal conduction (diffusion) sheets and thermally conductive resins are used for the thermal conductions. In order to effectively dissipate or cool the heat from a heat generation source, there is a need to combine these heat-dissipating and cooling methods so that the heat from a heat generating material may be efficiently transferred to a heat-dissipating and cooling material such as a circuit substrate, a cooling fin, a heat sink, or the like. For that purpose, it is important to reduce the thermal resistance between the heat generating material and the heat-dissipating and cooling material.

When the heat generating material and the heat-dissipating and cooling material are simply coupled with each other, the coupling between the heat generating material and the heat-dissipating and cooling material only forms point contacts due to the unevennesses on the surfaces of both the heat generating material and the heat-dissipating and cooling material. As a result, a thermal resistance becomes large due to the existence of an air layer having a low thermal conductivity (thermal conductivity: 0.02 W/mK) between the heat generating material and the heat-dissipating and cooling material. In order to lower such thermal resistance between the heat generating material and the heat-dissipating and cooling material, a thermal interface material (Thermal Interface Material, hereafter abbreviated as TIM) is interposed between materials such as between metals or between a metal and a ceramic. Therefore, the decrease of the thermal resistance requires high thermal conductivity of the TIM itself and low interfacial thermal resistance between the heat generating material or the heat-dissipating and cooling material and the TIM.

In order to reduce the interfacial thermal resistances, there is a need to increase the contact areas at the interface (to approximate to surface contact). Conventionally, for that purpose, a mixture of a polymer material having flexibility and fluidity for achieving surface contact and a highly thermally conductive inorganic filler for providing the TIM itself with a high thermal conductivity has been used (polymer-inorganic composite, hereafter abbreviated as composite TIM). The composite TIM can reduce the thermal resistance between the heat generating material and the heat-dissipating and cooling material because the surface contact is formed at the interface, and the air layer is removed from between the heat generating material and the heat-dissipating and cooling material. However, in such a composite TIM, there is a problem that the flexibility and the fluidity are lost due to the increase of the thermal resistance at the interface when the amount of addition of the highly thermally conductive inorganic filler is increased for achieving high thermal conductivity.

Further, in the composite TIM, a polymer such as an acrylic resin, an epoxy resin, or a silicone resin is used as a flexible polymer material constituting a matrix. However, as long as such a matrix polymer is used, the polymer material can hardly be used, for example, in an environment having a severely high temperature exceeding 200° C. For this reason, there is a strong demand for a TIM excellent in heat resistance and durability that can withstand rise in the heat generation amount accompanying the higher speed of microprocessors or higher performance of LED chips in recent years or that can be used in a severe thermal environment such as a vicinity of an automobile engine.

However, in the conventional TIM, there is a problem that the thermal resistance is largely affected by the unevenness of the surfaces of the actually interposing materials. From such a viewpoint, in an actual composite TIM, the conventional TIM has the larger thickness in consideration of the unevenness of the interposing materials. Therefore, the composite TIM typically has a thickness of about 0.5 mm to 5 mm because the TIM needs to enter the uneven part of the interposing materials.

Accordingly, the present inventors have developed a TIM made of a thinner graphite film. Specifically, the present inventors have developed the TIM made of the graphite film in which a thickness of the graphite film is 10 nm to 15 μm, a thermal conductivity in the film surface direction of the graphite film is 500 W/mK or more, and anisotropy of thermal conductivities is 100 or more in both the surface direction and the thickness direction of the graphite film. On the other hand, the present inventors have filed a patent application (Patent Document 1) by finding out that the TIM made of the graphite film exhibits excellent thermal resistance properties of from 0.98 K·cm²/W (thickness of 13 μm) to 0.33 K·cm²/W (thickness of 105 nm) under a pressure, for example, of 1.0 kgf/cm².

PRIOR ART

Patent Document

Patent Document 1: JP-A-2014-133669

SUMMARY OF THE INVENTION

Problem to be Solved by the Invention

However, in the case where the composite TIM is used for the materials having unevenness on surfaces, the thermal resistance thereof typically is increased several times as large as the thermal resistance in the case where the TIM is interposed between mirror-surface materials. As a practical property of the TIM, the thermal resistance is represented by a sum of the thermal resistance of the TIM itself and the thermal resistance at the interface, so that the thermal resistance of the composite TIM is about 0.4 K·cm²/W to 4.0 K·cm²/W. However, there is a problem that this thermal resistance is largely affected by the unevenness of the surfaces of the actually interposing materials. Like this, the thermal resistance of 0.4 K·cm²/W to 4.0 K·cm²/W in the aforementioned composite TIM is measured in the case where the TIM is interposed between the materials having approximately mirror-like surfaces, while the thermal resistance becomes larger when the TIM is interposed between practical materials having unevenness. Accordingly, when the TIM is interposed between materials having unevenness, the TIM having a thermal resistance property of 1.0 K·cm²/W or less can be evaluated to have a sufficiently high performance.

Also, Patent Document 1 discloses that the property of a TIM made of the graphite film is particularly effective when the TIM is interposed between mirror-surface materials. However, when the TIM of Patent Document 1 is interposed between actual materials having unevenness, the thermal resistance thereof cannot be sufficiently lowered. Thus, an object of the present invention is to provide a thermal interface material having low thermal resistance properties equivalent to or more than that of an already existing TIM even when interposing between practical materials having unevenness, and having excellent heat resistance and durability which could not be achieved in a conventional composite TIM, a method for thermally coupling with the thermal interface material, and a method for preparing the thermal interface material.

Means for Solving the Problems

In order to further improve inventions of the prior-application (Patent Document 1), the present inventors have studied the influences on the thickness, the thermal conductivity, the anisotropy, and the wrinkle of the graphite film, and the like in detail. As a result, the present inventors have found out that an excellent thermal coupling can be achieved with even already existing materials having unevenness, by implementing an optimal wrinkle on a specific graphite film (in the present invention, the optimal wrinkle is specified by the arithmetic average roughness Ra of the graphite film), thereby completing the present invention. Specifically, the TIM made of the graphite film of the present invention has a smaller thickness as compared with a composite TIM and thus has an extremely small thermal resistance as a bulk, so that the TIM made of the graphite film of the present invention has a high thermal conductivity property in the film plane direction. In addition, the combination of the high thermal conductivity property and the optimal wrinkle results in specific effects as described later (in the present invention, this is referred to as multiple-point coupling effects). Further, the present inventors have found that these effects can have the interfacial resistance thereof (thermal resistance of the interface) extremely small even between materials having unevenness, which was not conventionally known in the art. A specific thermal resistance to be achieved is 1.0° C.·cm²/W or less under applied pressure of 0.2 MPa. Here, in the present specification, "application of a pressure" is also referred to as "application of a load".

Also, the thermal coupling with a solid TIM of the present invention can produce a specific thermal coupling property such as the extremely decreased pressure dependency of the thermal resistance. Specifically, the differences in thermal resistances between 0.1 MPa pressure application and 0.5 MPa pressure application (that is, the ratio of the thermal resistance on a load of 0.1 MPa to the thermal resistance on a load of 0.5 MPa) can be decreased within a range of three times or less. In the solid TIM, the facts that the thermal resistance thereof is extremely small under such a low pressure and that the pressure dependency thereof is extremely small are not conventionally known in the art. According to such a pressure dependency, a low thermal resistance property can be achieved with a small pressure application and mechanical fastening at a strong force is not needed. Therefore, this represents a practically extremely useful property that the thermal resistance thereof is affected little even when mechanical fastening is loosened.

When the materials usable in the present invention have unevenness of 5.0 μm or less on the basis of surface roughness Ra, many practical materials have surface roughness within the above Ra range, so that the present invention can be applicable to these materials. The surface roughness Ra is obtained as follows. When a part of a reference length L is cut along with an average line direction from a roughness curve expressed by Y=f(X) regarding the average line of the cut part as the X axis and regarding a longitudinal direction as the Y axis, the arithmetic average roughness Ra is the value obtained by the following formula (1) and expressed in μm.

[Mathematical Formula 1]

$$R_a = \frac{1}{l} \int_0^l |f(x)| dx \quad (1)$$

A thermal interface material of the present invention transfers heat by interposing between two materials, the thermal interface material comprises a graphite film, the graphite film has a thickness of 1 μm to 50 μm, a density of 1.40 g/cm³ to 2.26 g/cm³, a thermal conductivity of 500 W/mK to 2000 W/mK (preferably more than 500 W/mK and 2000 W/mK or less) in a film plane direction, and an arithmetic average roughness Ra of 0.1 μm to 10 μm on a surface of the graphite film.

In a preferable embodiment, the present inventors further have found that, not only the size of the wrinkle but also the uniformity of the wrinkle is important in the low thermal resistance property. Principally, the uniformity of wrinkle of the graphite film is evaluated by a ratio of (Ra/Rave) in which the Ra is an arithmetic average roughness measured at each of the plural sites and the Rave is an average of all the arithmetic average roughnesses determined from the measurement results of the total plural sites. Generally, it is impossible to measure the Ra of all the sites in a predetermined area, and it is extremely difficult to describe the wrinkle quantitatively. For this reason, the uniformity of wrinkles can be quantitatively evaluated by a method shown in FIG. 1. First, a graphite film as a sample is cut to a size of 50×50 mm², and the surface roughness Ra is measured in the line-segment directions at five sites shown by black lines in FIG. 1. In FIG. 1, 1α is a midpoint of each side of the about 50 mm square graphite film; 1β is a midpoint of the black line segment at each of the five sites; and 1γ is the centroid of the about 50 mm square graphite film. Among the line segments at the five sites, one line segment, forms an angle of 45° relative to each side of the graphite film, and the midpoint of the line segment coincides with the centroid of the graphite film. Further, the other four line segments are respectively parallel to the four sides of the graphite film, and the distance to the nearest side is 4 mm. The line segment that connects the midpoint 1β of each line segment to the midpoint 1α of the nearest side is perpendicular to the nearest side. As a result, when measurement is made by such a method, (Ra/Rave) is preferably within a range of 0.2 to 5.0 in order to achieve the excellent thermal resistance property of the present invention. The aforementioned (Ra/Rave) of 0.2 to 5.0 means that the values of $Ra_i$/Rave are all within a range of 0.2 to 5.0, assuming that the arithmetic average roughnesses measured at the aforementioned five sites are respectively $Ra_i$ (i is one of 1 to 5) and that the average value of $Ra_1$ to $Ra_5$ is Rave. When the area of the graphite film is smaller than 50×50 mm², the graphite film may be cut to have a square shape, and the measurement points may be set at the four line segments that are respectively parallel to the four sides of the square and spaced apart by a predetermined distance therefrom and at the line segment located on the diagonal line of the square, in the same manner as in the aforementioned case of 50×50 mm². However, the (Ra/Rave) as an index for evaluating the uniformity of wrinkles defined in the preferable embodiment of the present invention is inherently measured by the method described in FIG. 1, so that, even if the (Ra/Rave) measured by a method other than this (that is, fluctuation of Ra) is out of the range of 0.2 to 5.0, this case may be included in the preferable range of the present invention.

As mentioned above, the thermal resistance property of a TIM is also affected by the unevenness of the materials. In the TIM made of the graphite film of the present invention, even when a wrinkle of the present invention is provided in the graphite film, the graphite film cannot be applicable to the unevenness of all sizes of the materials. The thermal resistance of 1.0° C.·cm²/W or less on an applied pressure of 0.2 MPa can be completed in the case where the surface unevenness of the materials is 5.0 μm or less as the arithmetic average roughness Ra and is 25 μm or less as the ten-points-average roughness Rz. With respect to the unevenness that exceeds these values, it is difficult to achieve the property of 1.0° C.·cm²/W or less even when the TIM made of the graphite film of the present invention is used. On the other hand, in the case where the surface unevenness of the materials is less than 0.2 μm as Ra and is less than 1.0 μm as Rz, there is no need to form a special wrinkle like that of the present invention. In other words, the present invention contains an optimal TIM suitable for thermal coupling two materials such that the Ra representing the surface roughness of at least one material is 0.2 μm to 5.0 μm, and the Rz value is 1.0 μm to 25 μm. According to the TIM of the present invention, the thermal resistance can be decreased to 1.0° C.·cm²/W or less (provided that the pressure of 0.2 MPa is applied).

The method for thermally coupling with the thermal interface material has a feature that the pressure dependency of the thermal resistance can be extremely decreased in addition to the decreased thermal resistance. Specifically, the method for thermally coupling two materials with the thermal interface material of the present invention has a feature that each of the two materials has an arithmetic average roughness Ra of 0.2 μm to 5.0 μm and a ten-point-average roughness Rz of 1.0 μm to 25 μm on a surface of each of the two materials, and a difference between a thermal resistance $R_{0.1}$ on a load of 0.1 MPa and a thermal resistance $R_{0.5}$ on a load of 0.5 MPa is three times or less.

The TIM made of the graphite film of the present invention has excellent heat resistance and durability and can be suitably used in a severe thermal environment. In the TIM of the present invention, an increasing rate of the thermal resistance can be controlled in 20% or less relative to the thermal resistance before the durability test when the durability test is carried out at 150° C. for 240 hours under air. Therefore, the method for thermally coupling with the thermal interface material made of the graphite film of the present invention is extremely effective in the case where at least one material has a temperature of 150° C. or more.

A method for preparing a TIM made of the graphite film of the present invention is not limited particularly, and it is preferable that the polymer film is carbonized and graphitized to prepare the graphite film.

The kinds of the polymer materials are not limited particularly, and the polymer film preferably contains a condensed aromatic polymer.

It is preferable that the condensed aromatic polymer comprises an aromatic polyimide and has a thickness of 1.67 μm to 125 μm, the aromatic polyimide is carbonized and graphitized at a temperature of 2400° C. or more to prepare the graphite film.

A method for providing an optimal wrinkle (surface toughness) with the graphite film is not limited particularly, and it is preferable that in at least one of the carbonizing step (the carbonization step) and the graphitizing step (the graphitization step), the polymer film, the carbonized film, or the graphite film is supported at multiple points, the polymer film, the carbonized film, or the graphite film is carbonized and/or graphitized while pressing.

It is preferable that in at least one of the carbonizing step (the carbonization step) and the graphitizing step (the graphitization step), a spacer having a surface roughness Ra of 0.1 μm to 10 μm is laminated on at least one plane (preferable both plane) of the polymer film, the carbonized film, or the graphite film, and a laminate of the spacer and the polymer film, the carbonized film, or the graphite film is carbonized and/or graphitized while pressing.

The spacer is not limited particularly as long as the spacer has a desirable unevenness, durability, and heat resistance, and it is preferable that the spacer comprises a felt composed of a carbon such as a carbon fiber or a graphite fiber.

Specifically, the present invention to solve the above problem is as follows:
(1) A thermal interface material for transferring heat by interposing between two materials, wherein the thermal interface material comprises a graphite film, the graphite film has a thickness of 1 μm to 50 μm, a density of 1.40 g/cm³ to 2.26 g/cm³, a thermal conductivity of 500 W/mK to 2000 W/mK in a film plane direction, and an arithmetic average roughness Ra of 0.1 μm to 10 μm on a surface of the graphite film.
(2) The thermal interface material according to (1), wherein a ratio of each of arithmetic average roughnesses Ra on two or more parts of the surface of the graphite film to an average Rave of the arithmetic average roughnesses Ra is 0.2 to 5.0.
(3) A method for thermally coupling two materials with the thermal interface material according to (1) or (2), wherein each of the two materials has an arithmetic average roughness Ra of 0.2 μm to 5.0 μm and a ten-points-average roughness Rz of 1.0 μm to 25 μm on a surface of each of the two materials, and a thermal resistance of the thermal interface material is 1.0° C.·cm²/W or less on a load of 0.2 MPa.
(4) A method for thermally coupling two materials with the thermal interface material according to (1) or (2), wherein each of the two materials has an arithmetic average roughness Ra of 0.2 μm to 5.0 μm and a ten-points-average roughness Rz of 1.0 μm to 25 μm on a surface of each of the two materials, and a ratio of a thermal resistance $R_{0.1}$ on a load of 0.1 MPa to a thermal resistance $R_{0.5}$ on a load of 0.5 MPa of the thermal interface material is 1.0 to 3.0.
(5) A method for thermally coupling two materials with the thermal interface material according to (1) or (2), wherein each of the two materials has an arithmetic average roughness Ra of 0.2 µm to 5.0 µm and a ten-points-average roughness Rz of 1.0 µm to 25 µm on a surface of each of the two materials, and an increasing rate of the thermal resistance of the thermal interface material is 20% or less relative to the thermal resistance before the durability test when the durability test is carried out at 150° C. for 240 hours under air.

(6) A method for preparing the thermal interface material according to (1) or (2), comprising carbonizing a polymer film to form a carbonized film, and graphitizing the carbonized film to form a graphite film.

(7) The method for according to (6), wherein the polymer film comprises a condensed aromatic polymer.

(8) The method according to (6) or (7), comprising carbonizing and graphitizing the polymer film at a temperature of 2400° C. or more, wherein the polymer film comprises an aromatic polyimide and has a thickness of 1.67 µm to 125 µm.

(9) The method according to any one of (6) to (8), wherein in at least one of the carbonizing step (the carbonization step) and the graphitizing step (the graphitization step), the polymer film, the carbonized film, or the graphite film is supported at multiple points, the polymer film, the carbonized film, or the graphite film is carbonized and/or graphitized while pressing.

(10) The method according to any one of (6) to (b 9), wherein a spacer is laminated on each plane of the polymer film, the carbonized film, or the graphite film, and a laminate of the spacer and the polymer film, the carbonized film, or the graphite film is carbonized and graphitized.

(11) The method according to (ID), wherein the spacer has a surface roughness Ra of 0.1 µm to 10 µm.

(12) The method according to (10) or (11), wherein the spacer comprises a felt composed of a carbon fiber or a graphite fiber.

Effect of the Invention

According to the present invention, when the thermal interface material is interposed between materials having unevenness, the decreased thermal coupling property is accomplished in 1.0° C.·cm$^2$/W or less, the pressure dependency of the thermal resistant is greatly reduced, and the interfacial thermal coupling is excellent in environment stability such as heat resistance.

BRIEF DESCRIPTION OF THE DRAWINGS

FIG. 1 shows a method of measuring the arithmetic average surface roughness (Ra) in the present invention. For the measurement, a graphite film having a 50 mm square shape is used, and the measurement sites of the surface roughness Ra are the five sites shown by the line segments in FIG. 1. In FIG. 1, 1α is a midpoint of each side of the graphite film; 1β is a midpoint of the line segment, at each of the five sites; and 1γ is a centroid of the graphite film. The surface roughness (arithmetic average roughness Ra) is measured in the line-segment direction at the five sites.

FIG. 2 is a cross-sectional view illustrating a state of wrinkle in a graphite film of the present invention, where FIG. 2(a) is an image of a cross-section of a graphite film having a portion in which almost no wrinkle is partially present and having a partially non-uniform and large unevenness; FIG. 2(b) is an image of a schematic cross-section of the graphite film having an uniform and large unevenness which is out of the range of the present invention; FIG. 2(c) is an image of a schematic cross-section of a graphite film having an optimal unevenness of the present invention; and FIG. 2(d) is an image of a schematic cross-section of a graphite film with little unevenness, which is out of the range of the present invention.

FIG. 3 is an example of a surface photograph of an actual graphite film, where FIG. 3(a) is an example of a graphite film having a non-uniform and large wrinkle; FIG. 3(b) is an example of a graphite film having a uniform and large wrinkle; FIG. 3(c) is an example of a graphite film having a uniform and preferable size wrinkle; and FIG. 3(d) is an example of a graphite film with little wrinkle, rigs. 3(a), 3(b), 3(c), and 3(d) are actual examples of the cross-sectional images shown in FIG. 2, and correspond to FIGS. 2(a), 2(b), 2(c), and 2(d), respectively.

FIG. 4 is a cross-sectional SEM photograph of a graphite film (FIG. 3(c)) of the present invention, where a suitable and uniform wrinkle is formed on the graphite film.

FIG. 5 is a schematic view of one example of a method for preparing a TIM made of a graphite film of the present invention where the graphite film sandwiched with flat plane substrates is pressed and fired.

FIG. 6 shows a principle (1) of a method for measuring the thermal resistance between materials having surface roughness (that is, having surface unevenness). By interposing the TIM between the materials having a surface roughness (unevenness), the thermal resistance thereof is measured while changing the surface roughness test by test.

FIG. 7 shows a principle (2) of a method for measuring the thermal resistance property between materials having surface roughness. By using copper foils having an unevenness of a certain size on one surface, measurement is carried out by interposing the TIM made of the graphite film between the copper foils. The other surface of the copper films is assumed to be an almost mirror-like surface, and this surface is coupled to a rod of a measurement apparatus via a thermal measurement rod and a silicone grease.

FIG. 8 shows a principle (3) of a method for measuring the thermal resistance property between materials having surface roughness. The thermal resistance is measured when both surfaces of a copper foil assumed to have an almost mirror-like surface is coated with a silicone grease. The value obtained by this measurement is subtracted from the thermal resistance measured by the method shown in FIG. 7.

MODE FOR CARRYING OUT THE INVENTION

The thermal resistance property (property of transferring heat) of a TIM (thermal interface material) obtained by the present invention is compared with the thermal resistance property of a TIM made of the graphite film obtained by the prior application (Patent Document 1). Patent Document 1 discloses that a thermal resistance is 0.98 to 0.33° C.·cm$^2$/W on a pressure with 1.0 kgf/cm$^2$ when a graphite film has a thickness of 13 µm to 18 nm, and the thermal resistance is 0.38 to 0.98° C.·cm$^2$/W when the thickness of the graphite film is 1 µm or more, which is within the thickness range of the present invention (N.B.: in the present invention, the size of the pressurizing load is represented by MPa. The load of 1.0 kgf/cm$^2$ is almost equal to 0.1 MPa.). However, these properties are inherently properties between electrodes subjected to mirror surface polishing, as measured try a thermal resistance measurement apparatus. Therefore, when the graphite film of Patent Document 1 is actually applied between materials having unevenness, the thermal resistance property becomes a value as large as two to five times. What extent the thermal resistance increases to cannot be specified because the extent of increase of the thermal resistance changes in accordance with the size of the unevenness of the materials. However, the thermal resistance tends to be larger as the graphite film is used between materials having a larger unevenness. Here, in the present invention, the two materials thermally coupled with each other are simply referred to as "materials" or "parts".

For this reason, copper foils having different surface roughnesses are prepared, and the thermal resistances between materials having unevenness are measured by changing the surface roughness test by test by the method described in the Examples. As a result, the thermal resistance property obtained in Patent Document 1 increases to a large extent. For example, when the TIM made of the graphite film is interposed between copper foils having a surface roughness Ra of 0.26 μm, the thermal resistance increases to be as large as about three times. In other words, the thermal resistances of 0.38 to 0.98° C.·cm$^2$/W obtained in the aforementioned Patent Document 1 equal to the thermal resistances of 1.2 to 2.4° C.·cm$^2$/W. From such results, the thermal resistance of 1.0° C.·cm$^2$/W or less is targeted for the TIM of the present invention, and the TIM having such properties has keen developed.

First, we have studied a method for decreasing the increase of the thermal resistance even when the TIM is interposed between the materials having the unevenness. As results of many studies, we have found that when an optimal wrinkle is formed on the graphite film, the thermal resistance is greatly decreased, to complete the present invention. In the present invention, the thermal resistance can be lowered to 1.0° C.·cm$^2$/W or less, and the lowest thermal resistance is 0.2° C.·cm$^2$/W. In the present invention, the thermal resistance of 1.0° C.·cm$^2$/W or less can be achieved on a load of 0.5 MPa, and this value may be achieved on a load of 0.2 MPa or 0.1 MPa. In the case of the load of 0.2 MPa, the thermal resistance is preferably 0.9° C.·cm$^2$/W or less, more preferably 0.8° C.·cm$^2$/W or less, and even preferably 0.7° C.·cm$^2$/W or less. Thus, the availability of the decreased thermal resistance resulted from the interposing of the TIM made of the graphite film having an optical wrinkle between the materials having unevenness is an unprecedented case.

The method for thermally coupling with the thermal interface material of the present invention has a feature that the pressure dependency of the thermal resistance is small. The TIM made of the graphite film having a thickness of 1 μm to 50 μm of the present invention realizes decreased pressure dependency such that a ratio of the thermal resistance on a load of 0.1 MPa to the thermal resistance on a load of 0.5 MPa is three times or less. That is, a ratio of a thermal resistance $R_{0.1}$ on a load of 0.1 MPa to a thermal resistance $R_{0.5}$ on a load of 0.5 MPa of the thermal interface material, or a ratio of $R_{0.1}/R_{0.5}$, can be 3.0 or less. The ratio of $R_{0.1}/R_{0.5}$ is preferably 2.5 or less, and more preferably 2.2 or less. $R_{0.1}/R_{0.5}$ is 1.0 or more because $R_{0.1}$ is larger than $R_{0.5}$. In addition, in Examples as set forth below, $R_{0.1}$ and $R_{0.5}$ refer to $R_{0.1P}$ and $R_{0.5P}$, respectively.

Further, the TIM of the present invention has a feature that excellent heat resistance and durability are exhibited compared to conventional composite TIM. For example, in the TIM of the present invention, the increasing rate of the thermal resistance after 150° C. for 240 hours can be controlled in 20% or less. Such a thermal resistant, property is much beyond the conventional composite TIM.

Hereinafter, the present invention is explained in detail.
(A) Graphite Film

In the present invention, the graphite film has a thickness of preferably 1 μm or more, more preferably 2 μm or more, even preferably 3 μm or more, and most preferably 4 μm or more. In addition, the graphite film of the present invention has a thickness of preferably 50 μm or less, more preferably 40 μm or less, and especially preferably 30 μm or less. When the graphite film has a thickness of more than 50 μm, the thermal resistance becomes large. On the other hand, when the graphite film has a thickness of 1 μm to 50 μm, even if the thermal interface material is used between the materials having unevenness, the excellent heat resistant property can be accomplished than that of the TIM made of the graphite film of Patent document 1. The thermal resistant property of 1.0° C.·cm$^2$/W or less is much excellent compared to that of conventional composite TIM, and the TIM made of the graphite film of the present invention has excellent heat resistance and durability.

In order to accomplish such a property, the graphite film; of the present invention preferably has a density of 1.40 to 2.26 g/cm$^3$, a thermal conductivity of the film plane direction of 500 W/mK or more (particularly preferably more than 500 W/mK). The graphite film has a density of more preferably 1.60 g/cm$^3$ to 2.26 g/cm$^3$, and most preferably 1.80 g/cm$^3$ to 2.26 g/cm$^3$. The density of 2.26 g/cm$^3$ is an ideal density in the graphite film containing no air layer. The inclusion of the air layer in the graphite film can be confirmed by measuring a density of the graphite film. It is desirable that there is little air layer within the graphite film because the air layer has an extremely decreased thermal conductivity. Like this, the density can be considered as a measure of the presence of the air layer.

Further, the TIM made of the graphite film of the present invention has the thermal conductivity in the film plane direction of preferably 500 W/mK or more, more preferably more than 500 W/mK, even preferably 600 W/mK or more, even more preferably 800 W/mK or more, and most preferably 1000 W/mK or more. The reason why it is important that the thermal conductivity in the film plane direction is large in the present invention can be described as follows. That, is, since the TIM made of the graphite film of the present invention has the extremely large thermal conductivity in the film plane direction of the graphite film, the heat that has flowed in from one coupling point is rapidly diffused within the TIM made of the graphite film and, as a result, the heat can flow from numerous coupling points to the materials on the lower-temperature side. In other words, the high thermal conductivity in the film plane direction of the graphite film produces the same effects as in the case where the graphite film is in contact at a larger number of coupling points than the actual number of coupling points. Such an effect is larger according as the thermal conductivity in the film plane direction is larger, so that the thermal conductivity in the film plane direction is important for the decreased thermal resistance. Thus, the present invention has found that the thermal conductivity in the film plane direction is important in improving the TIM properties.

The TIM made of the graphite film of the present invention has a feature that the graphite film has an arithmetic average roughness Ra of 0.1 μm to 10 μm on at least one plane, preferably both planes of the graphite film. The arithmetic average roughness Ra on the graphite film specified in the present invention may be an average of the arithmetic average roughnesses as measured at multiple sites on the graphite film and may be an average of the roughnesses measured at five sites as shown in the above FIG. 1. The arithmetic average roughness Ra is preferably 0.2 μm or more, more preferably 0.3 μm or more, and even preferably 0.4 μm or more. The arithmetic average roughness Ra is preferably 8.0 μm or less, more preferably 6.0 μm or less, and even preferably 4.0 μm or less. The arithmetic average roughness Ra is more preferably 0.2 μm to 8.0 μm, even preferably 0.3 μm to 6.0 μm, and most preferably 0.4 μm to 4.0 μm. The arithmetic average roughness Ra is important to improve the thermal coupling between materials having unevenness, or to decrease the thermal resistance in the thermal coupling. The wrinkle represented by the above Ra is considered to be important to form a number of thermal coupling points on the basis of the wrinkles generated with the unevenness of materials.

Further, it is preferable that the TIM made of the graphite film of the present invention has the uniform wrinkles on the surface thereof. The uniform wrinkles result in the formation of coupling points over the whole thermal coupling plane and the heat smoothly flows over the whole coupling plane, so that the thermal resistance can be decreased. With the difficulties to define the uniformity of the wrinkle as numerical values, the present invention evaluates the uniformity of the wrinkle with a ratio of each of arithmetic average roughnesses Ra to an average of arithmetic average roughnesses Ra, that is, Ra/Rave. Concretely, when the arithmetic average roughnesses Ra are measured at five sites as in method of FIG. 1, the average of the arithmetic average roughnesses Ra is calculated from the measured arithmetic average roughnesses at all sites, and this is defined as Rave. Then, each Ra and Rave are substituted in a formula of Ra/Rave. As a result, the ratio of Ra/Rave is preferably 0.2 to 5.0 to decrease the thermal resistance properties. The ratio of Ra/Rave is more preferably 0.3 or more, even preferably 0.4 or more, most preferably 0.5 or more, and is more preferably 4.0 or less, even preferably 3.0 or less, and particularly preferably 2.0 or less. In addition, the ratio of Ra/Rave is more preferably 0.3 to 4.0, even preferably 0.4 to 3.0, and most preferably 0.5 to 2.0.

The above graphite film can thermally couple materials having the arithmetic average roughness Ra of 5.0 μm or less and the ten-points-average roughness Rz of 25 μm or less on the surfaces of the materials with decreased thermal resistance of 1.0° C.·cm$^2$/W or less on a load of 0.2 MPa. The materials may have the arithmetic average roughness of 0.2 μm or more and the ten-points-average roughness of 1.0 μm or more.

(B) Method for Preparing Polymer Film

A method for preparing the graphite film is not limited particularly and the graphite film can be prepared by baking of the polymer film. The polymer is preferably a condensed aromatic polymer, and the polymer is preferably at least one selected from polyamide, polyimide, polyquinoxaline, polyoxadiazole, polybenzimidazole, polybenzoxazcle, polybenzthiazole, polyquinazolinedione, polybenzoxazinone, polyquinazolone, benzimidazobenzophenanthroline ladder polymer, and derivatives thereof.

The polymer film is preferably a condensed aromatic polyimide film in the view of the conversion of the polymer film to the graphite. In addition, the condensed aromatic polyimide film is preferably a film having controlled molecular structures and higher structures and excellent orientation in the view of the simple conversion to the high quality graphite.

The condensed aromatic polyimide film can be produced by various publicly known techniques. For example, the polyimide film of the present invention is produced by casting the above-mentioned organic solvent solution containing a polyamic acid as a polyimide precursor on a support such as an endless belt or a stainless steel drum, drying and imidizing the solution. Examples of a method for producing a polyimide include, without limiting particularly, a thermal cure method in which a polyamic acid of a precursor is imidized by heating, and a chemically curing method in which both or one of a dehydrating agent typified by acid anhydrides such as acetic anhydride and tertiary amines such as picoline, quinoline, isoquinoline and pyridine, is used as an imidization accelerator for polyamic acid to perform imidization.

Specifically, a method for preparing a polyimide film using the chemically curing method is as follows. The dehydrating agent containing a larger amount than an amount of stoichiometry and the imidization accelerator containing the same amount as a catalyst are added to a solution containing a polyamic acid and an organic solvent to prepare a mixture, the mixture is casted or coated on a substrate, an organic film such as PET, or a supporting body such as drum or endless belt to prepare a film-like layer, drying the organic solvent by heating to prepare a film having mechanical strength. Then, the film is further heated, dried, imidized to prepare a polyimide film composed of the polyimide polymer. The temperature of heating is preferably the range of from 150° C. to 550° C. The increasing rate of the temperature for heating the polymer is not limited particularly, and it is preferable that the polymer is continuously, intermittently or gradually heated to control the maximum temperature within the above range. Further, in the course of the preparation of the polyimide, it is preferable that the film is fixed or expanded to prevent the shrinkage. The fixation or the expansion of the film can increase the orientation of the polymer. The polyimide film has, for example, an average linear thermal expansion coefficient of $0.5\times10^{-6}$ to $5.0\times10^{-5}$ cm/cm/° C. at 100° C. to 200° C. and a birefringence of 0.1 to 0.2.

The thickness of the graphite film finally obtained is changed according to a thickness of a polymer film as a raw material. In the aromatic polyimide, a thickness of the graphite film finally obtained is commonly often about 60% to 40% of a thickness of a starting polymer film having a thickness of 1 μm or more. Accordingly, in order to obtain a graphite film of the present invention having a thickness of 1 μm to 50 μm, a starting polymer film preferably has a thickness of from 1.67 μm to 125 μm.

(C) Method for Preparing Graphite Film

A method for preparing a TIM made of the graphite film of the present invention is not limited particularly, and the graphite film is preferably prepared by carbonization and graphitization of a polymer film. The carbonization and the graphitization may be carried out at one furnace or separate furnaces. The carbonization and the graphitization of the polymer film is explained as follows. The carbonization is not limited particularly, and the polymer film of a starting material is preliminarily heated to carbonize the polymer film in an inert gas or in a vacuum. The inert gas preferably includes nitrogen gas, argon gas, a mixed gas of argon and nitrogen. The preliminary heating is carried out at a temperature of 600° C. to 1000° C. The increasing rate of the temperature to the preliminary heating temperature is not limited particularly, and for example 5 to 15° C./minute and preferably 8 to 12° C./minute. The holding time of the preliminary heating temperature is for example 30 minutes to 2 hours. It is desirable that the tension of the plane direction is applied at a degree of no break of the film such that the orientation of the starting polymer film is not decreased at the stage of the preliminary heating.

The graphitization of the polymer is not limited particularly, and the film carbonized with the above method is set in a furnace at a high temperature to graphitize the film. The graphitization is carried out in an inert gas, and the inert gas is appropriately argon and both argon and helium in a small amount may be used. The temperature for the graphitization is preferably 2400° C. or more, more preferably 2600° C. or more, and most preferably 2800° C. or more from the view of the conversion to high quality graphite film at a higher temperature. The graphitization may be carried out at a given time, and the holding time for the graphitization is for example 5 minutes or more, preferably 10 minutes or more, and the holding time for the graphitization may be 20 minutes or less. The upper limit of the temperature for the graphitization is not limited particularly, and the temperature for the graphitization may be 3600° C. or less, and 3500° C. or less. The increasing rate of the temperature of from the preliminary heating to the graphitization is not limited particularly, and for example 10 to 30° C./minute, and preferably 15 to 25° C./minute. After the graphitization, the temperature may be decreased at, for example 30 to 50° C./minute.

(D) Shape and Evaluation of Optimal Wrinkles

The graphite film prepared with the general methods has both regions with little wrinkles and regions with many uneven wrinkles (roughnesses) over the whole film plane. Also, it is hard to control the sizes of unevenness of the formed wrinkles. FIG. 2(a) is an image of a schematic cross-section of a graphite film having sites with little partial wrinkles or sites with uneven wrinkles of partially large unevennesses. Generally, the uneven wrinkles are produced in many cases where the carbonization and the graphitization are carried out without devised means as set forth below. Further, in the conventional preparation methods, it is hard to control not only the uniformity of the wrinkles but also the size of unevennesses of the wrinkles. Therefore, the conventional graphite film having no controlled wrinkles has great influences on the properties of the TIM, and it is preferable that the method for preparing the graphite film has a new devise in order to prepare the graphite film having controlled wrinkles.

In order to achieve excellent TIM properties in a preferable embodiment, the present inventors have clarified that it is important to control the uniformity of the wrinkles (unevennesses) of the graphite film. FIG. 2(b) is an image view of a schematic cross-section of a graphite film having a large and uniform wrinkle which is out of the range of the present invention, and schematically shows a state in which Ra exceeds 10 μm. FIG. 2(c) is an image view of a schematic cross-section of a graphite film having an optimal wrinkle of the present invention, and schematically expresses the case where Ra is 0.1 to 10 μm. FIG. 2(d) is an image view of a schematic cross-section for describing a TIM made of a graphite film with little wrinkle, which is out of the range of the present invention, and schematically shows a state in which Ra is less than 0.1 μm.

FIG. 3 shows an example of an actual surface photograph of the schematic cross-sectional image of a graphite film shown in FIG. 2. FIGS. 3(a), 3(b), 3(c), and 3(d) correspond to FIGS. 2(a), 2(b), 2(c), and 2(d), respectively. Also, FIG. 4 is a cross-sectional SEM photograph of a graphite film in the state of FIG. 3(c), where a wrinkle having a suitable height has been uniformly formed. As described previously, FIG. 3(a) is an example in which a wrinkle is often generated in the case where the carbonization and the graphitization are carried out without applying a pressure. Further, FIG. 3(b) is an example in which a wrinkle is often generated in the case where the carbonization is carried out by interposing with mirror-surface jigs, and the graphitization is carried out without applying a pressure. FIG. 3(c) is an example in which a graphite film has an optimal wrinkle that has been formed by the below-described technique of the present, invention. Further, FIG. 3(d) is an example in which a graphite film has little wrinkle, which can be possibly obtained when the carbonization and the graphitization are carried out by interposing with mirror-surface jigs.

As studied results, the TIM excellent in properties cannot be prepared when wrinkles as shown in FIGS. 3(a) and (b) are formed and when the graphite film has no wrinkles as shown in FIG. 3(d). On the other hand, the TIM excellent in properties can be prepared when the graphite film has a controlled wrinkle having a suitable size as shown in FIG. 3(c). However, a method for controlling a size of the wrinkle of the graphite film as shown in FIG. 3(c) has not been known, and there is a need to develop a method for controlling a wrinkle of the graphite film to provide an optimal wrinkle.

In other words, the TIM made of the graphite film of the present invention is preferably formed in such a manner that the wrinkles as shown in FIG. 2(c) are controlled to be within a suitable range by avoiding the states as shown in FIGS. 2(a), 2(b), and 2(d). Such an arithmetic average roughness Ra can be determined by an already existing method, that is, an optical method such as a probe-type surface roughness meter or a laser microscope, or a method such as STM (Scanning Tunneling Microscope) or AFM (Atomic Force Microscope). For example, JIS B0601-2001 can be applied in the measurement of the arithmetic average roughness Ra.

The method for controlling the size and the uniformity of the wrinkles of the graphite film to be within a preferable range as shown in FIG. 2(c) has not conventionally been known in the art. Therefore, there has been a need to develop a new method in order to impart a wrinkle having a suitable roughness on the graphite film. The present inventors have found out that a preferable wrinkle can be formed when, in at least one of the carbonization step and the graphitization step, a spacer having an unevenness of a suitable size is laminated onto one surface (preferably both surfaces) of at least one of the sample such as a polymer film, a carbonized film, or a graphite film, interposing these between flat and smooth jigs, and treating at a carbonization temperature and a graphitization temperature while pressurizing with a suitable pressure from both sides, thereby completing the present invention.

The surface roughness or the arithmetic average roughness Ra of the graphite film may be varied in an appropriate range according to the thickness of the graphite film satisfying the above range. In a preferred embodiment, the uniformity of the wrinkle needs to realize the stable properties of the TIM. As an index of the uniformity of the wrinkles, a ratio of each of multiple arithmetic average roughnesses Ra to an average of multiple arithmetic average roughnesses Ra is effective for the evaluation of the uniformity of the wrinkle. The ratio is represented by Ra/Rave in which arithmetic average roughnesses Ra are measured at five sites by the method shown in the FIG. 1, an average (Rave) of arithmetic average roughnesses Ra is obtained by measured results from all sites of five sites, to substitute each of multiple Ra and Rave in a formula of Ra/Rave. In the TIM made of the graphite film of the present invention, the fluctuation of roughness or the ratio of Ra/Rave is preferably 0.2 to 5.0. More preferably, each of Ra/Rave measured at five sites is 0.2 to 5.0. Thus, the TIM having the stable properties can be prepared by improving the uniformity of the wrinkles of the graphite film.

(E) Method for Controlling Wrinkles

In the present invention, a method for appropriately controlling a size and a uniformity of the wrinkle of the graphite film is not limited particularly. In conventional methods of preparing the graphite film from the polymer film, it is hard to form an optimal wrinkle. When the aromatic polyimide of the polymer film is carbonized, the carbonized film is shrunk to reduce the original area of the original polymer film by about 56% to 72% at the carbonization in many cases. In addition, the area of the finally obtained graphite film is enlarged compared with the carbonized film, and the dimension of the graphite film is about 72% to 90% of the dimension of original polymer film. Thus, due to natural shrinkage and expansion, a region where large wrinkles are biased and a region where there is little wrinkle coexist in the graphite film, so that appropriate wrinkles cannot be formed.

In the present invention, a suitable wrinkle is formed by controlling the shrinkage and expansion through a pressing treatment using a spacer. Specifically, a suitable wrinkle can be formed when a spacer having an unevenness with a suitable size is laminated onto one plane (preferably both planes) of one of a polymer film, a carbonized film, and a graphite film, interposing these between flat and smooth pressing plates or jigs, and treating at a carbonization temperature and a graphitization temperature while pressing with a suitable pressure from both sides. Here, the carbonization is carried out on a polymer film, and the graphitization is carried out on a carbonized film. Also, a re-graphitization may be carried out in accordance with the needs. The re-graphitization is carried out on a graphite film. In the case where the graphitization is carried out after a polymer film is carbonized, the aforementioned pressing treatment may be carried out in one or both of the carbonization step and the graphitization step.

FIG. 5 is a schematic cross-sectional view of a pressing method by interposing the film to be treated with flat plane substrates. The reference numerals 5a, 5b, and 5c denote a graphite film, a spacer, and a pressing jig, respectively. In this example, a spacer having a suitable unevenness is placed between two sheets of flat plane substrates (the pressing jigs), that is, between the pressing jig and the graphite film, and the spacer and the graphite film are pressurized with the flat plane substrates. The materials of the pressing plates and the spacer used in pressing the film to be treated are not particularly limited as long as the materials have durability against a high-temperature treatment; however, typically, the pressing plates or the spacer is preferably a carbon material or a graphite material. For example, a substrate made of CIP (Cold Isotropic Press: cold hydrostatic press) material that is isotropic graphite or glassy carbon can be used.

The spacer used in the present invention has unevenness of a suitable size, and the spacer has a surface roughness (Ra) of preferably 10 µm or less, more preferably 8 µm or less, and even preferably 5 µm or less. In addition, the spacer has a surface roughness (Ra) of preferably 0.1 µm or more, more preferably 0.2 µm or more, and even preferably 0.4 µm or more.

It is difficult to uniquely determine the pressing conditions because the pressing conditions depend on complex combination of the factors such as the spacer shape, the type of the film to be treated (polymer film, carbonized film, or graphite film) and the thickness. However, the pressing conditions may be set in consideration of the following conditions. In other words, a polymer film shrinks in the carbonization step and expands in the graphitization step, so that, the film is finely split in the shrinking step when the pressuring force is too strong. Also, a non-uniform wrinkle is generated in the graphitization step. On the other hand, when the pressuring force is too small, the unevenness of the spacer cannot be reflected as the unevenness of the graphite film. Accordingly, in the carbonization and the graphitization, the magnitude of the pressuring force is preferably changed in consideration of the elongation and shrinkage thereof instead of applying a uniform pressure.

The pressing of the carbonization and the graphitization may be continuous or intermittent and the pressing pressure can be appropriately set from the range of 1 gf/cm$^2$ to 2000 gf/cm$^2$. The pressing pressure is more preferably 2 gf/cm$^2$ or more, even preferably 5 gf/cm$^2$ or more, and particularly preferably 10 gf/cm$^2$ or more, and more preferably 1000 gf/cm$^2$ or less, even preferably 600 gf/cm$^2$ or less, and particularly preferably 400 gf/cm$^2$ or less.

The pressing time may be appropriately set according to various conditions or the pressing may be carried out multiple times. However, it is desirable that the pressing of the graphitization is not completed at early stages, and continues up to the maximum temperature. The reason is as follows. At the graphitization treatment, the dimension of the graphite film in the film plane direction is elongated until the film temperature becomes the highest temperature. Therefore, in many cases, uneven wrinkles of the graphite film are generated by an uneven elongation of the film at a final stage of the graphitization when the pressing is ended at a very early stage for the graphitization. In addition, the pressing of the graphitization desirably starts after the graphite film starts to expand. When the pressing is performed at the very early stage before the graphite film starts to expand and then continued as it is, the graphite film unfavorably comes not to be elongated although the film is originally elongated into the film plane direction. This also causes the generation of finally-obtained surface irregularities of the graphite film.

Thus, about the pressing timing, the pressing starts at a temperature of preferably 2200° C. or higher, more preferably 2400° C. or higher, and even preferably 2600° C. or more, and the pressing preferably continues up to the maximum temperature. The graphite film may be repeatedly pressed for a short period and may be further pressed also at the vicinity of the highest temperature. It is advisable to optimize appropriately the pressing pressure, period and timing, and other minute conditions, considering such a basis as described above.

The pressing means may be a pressing means (pressing mechanism) capable of controlling mechanical pressure or a non-mechanical means such as the pressing from the self-weight of the pressing plate or the pressing of a heavy stone made of graphite or carbon placed on the pressing plate. The non-mechanical means is suitable in applying a constant weak weight at all times during the carbonization and graphitization and can advantageously form a wrinkle having a suitable height in the graphite film.

The spacer is not particularly limited as long as the spacer has durability against both of the treatment temperature and the pressing force. The spacer may be a powdery particle or a film or woven cloth fabricated from a fibrous substance. In particular, a carbon-based or graphite-based particle (particularly a powdery particle) or a carbon-based or graphite-based fibrous substance (particularly a film or woven cloth prepared from the fibrous substance) is preferably used. Examples of the powdery particle include a glassy carbon particle, a graphite particle, and a graphite scale. Examples of the fibrous substance include a carbon fiber and a graphite fiber. Also, it is possible to use an inorganic particle or the like, such as scale-like silica, alumina, spherical alumina, or scale-like boron nitride at appropriate times. The materials of the sparer of the present invention include substances, such as silica, that cannot withstand up to a high temperature of 2800° C. or the like which is the final stage of graphitization; however, these materials may be used in the carbonization step. The powdery particle is more preferably a particle having a lubricating effect. The carbon-based or graphite-based spacer has advantages such as ready availability, hardly raising problems because of being the same type of carbon-based substance even when adhering to the graphite film or in the electric furnace, and certain lubricity.

The roughness (unevenness) of the spacer surface molded in a film shape or woven cloth shape gives a large influence on the unevenness formation of the graphite film to be fabricated. However, the roughness of the spacer surface and the magnitude of the surface roughness of the graphite film do not necessarily coincide with each other. This is because the unevenness of the spacer surface plays a role of supporting the graphite film at points in some cases. This is a large role of the spacer, and this can prevent breakage by shrinkage or expansion in the thermal treatment step of the graphite film. The application of the spacer is particularly conspicuous in the case where the applied pressure is small, and is an effective technique for preparing a TIM made of the graphite film having a large area.

An average particle size ($d_{50}$) of powdery particles as the spacer materials, a fiber diameter of fibrous substances as the spacer materials, and a thickness of scale as the spacer materials (hereinafter, the average particle size of the particles, the diameter of the fibers, and the thickness of the scales refer to as a thickness of the spacer in some cases) is, for example, 0.2 μm or more, preferably 0.5 μm or more, more preferably 1 μm or more, and for example, 200 μm or less, preferably 100 μm or less, and more preferably 50 μm or less. The spacer may be a sheet (preferably those as sandpapers) having uniformly distributed projections and containing the particles, the fibers, or the like and may be a non-woven fabricated with many fibrous substances.

Further, it is also preferable to use the spacer in combination with a paste, an oil, a wax, or the like in view of adjusting the lubricity and further finely controlling the degree of unevenness of the wrinkle of the graphite film to be formed. Also, the substance used for the paste, the oil, the wax, or the like may be suitably selected. For example, in the case of the oil, a mineral oil, a synthesized hydrocarbon oil, an ester oil, a polyglycol oil, a silicone oil, a fluorine oil, a canola oil, or a mixture of these can be suitably used. Alternatively, the oil may be a modified oil. For example, in the case of the silicone oil, an epoxy-modified silicone oil, a polyether-modified silicone oil, an amino-modified silicone oil, or an epoxy-modified silicone oil can be used. These paste, oil, wax, and the like are eventually lost in the thermal treatment step; however, these produce an effect of reducing the resistance between the sample and the spacer to provide easy sliding.

Further, unevenness may be provided on the surface of the pressing jig, and this unevenness may be used for the spacer. In this case, it is preferable to let the pressing plate surface have a certain shape or surface roughness by treating the pressing jig surface with a sand paper, a sand blast, or a polishing material. For such a purpose, it is possible to use a pressing plate made of a CIP material or glassy carbon whose surface has been uniformly-roughened to a certain degree, as the pressing jig. Further, it is also preferable to use a pressing plate made of a CIP material or glassy carbon in which a carbon fiber is allowed to firmly adhere to the surface of the plate by pressing the carbon fiber at a high temperature.

In the case of carbonizing or graphitizing the polymer film by supporting the raw material polymer film or the carbonized film at plural points such as in the method of forming wrinkles, the obtained graphite film may be broken when the pressure is too large or due to adhesion caused by static electricity. In such a case, it is preferable to perform static elimination with a suitable antistatic agent or an ionizer.

Various kinds of techniques described above for providing an optimal roughness on the TIM mace of the graphite film may be suitably selected in accordance with the production process without limiting to the contents of the Examples given below. Further, the method of preparing the TIM made of the graphite film of the present invention is excellent in productivity because numerous sheets can be stacked and fired at the same time. Also, the preparation method is applicable even in the case where the film to be treated has an extremely small thickness as in the range of the present invention and is liable to be physically broken.

According to the method of preparing the TIM made of the graphite film of the present invention, a uniform wrinkle having a suitable size can be formed on the graphite film.

(F) Method for Thermally Coupling with Thermal Interface Material

A method for thermally coupling materials with the TIM of the present invention includes a step of placing the aforementioned TIM between the materials to be thermally coupled. In other words, the method for thermally coupling with the thermal interface material of the present invention contains a method for transferring heat from one material (first material) to the other material (second material), including of placing (interposing) the thermal interface material according to the present invention between two materials having the arithmetic average roughness Ra of 0.2 μm to 5.0 μm and a ten-points-average roughness Rz of 1.0 μm to 25 μm on the surfaces of the graphite film, and of bringing the thermal interface material into contact with the two materials. By interposing the TIM of the present invention between the materials (between the first material and the second material), the thermal coupling with the TIM can be carried out by transferring heat from the heat generation source or the material thermally coupled to the heat, generation source (first material) to the second material having a lower temperature (preferably a temperature lower than that of the first material). The graphite film is placed by being interposed between the material near to the heat source and the material far from the heat source, and the graphite film is in direct surface contact with each material. The arithmetic average roughness Ra of the first and second materials is preferably 4.5 μm or less, more preferably 4.0 μm or less, and also, a low thermal resistance can be achieved even when Ra is 0.23 μm or more or 0.25 μm or more. Also, the ten-point-average roughness Rz of the first and second materials is preferably 23 μm or less, more preferably 20 μm or less, and also, a low thermal resistance can be achieved even when the ten-points-average roughness Rz is 1.5 μm or more or 1.8 μm or more.

In the present invention, an excellent and thermostable interface thermal coupling can be realized simply with the graphite film alone even when various kinds of bonding layers are not used. In other words, thermal coupling having an excellent thermostability and durability can be made without using the bonding layers. As a method for realizing the interface thermal coupling without the intervention of the bonding layers, fixation may be made with a simple mechanical pressure. Mechanical swaging with a screw, a thread, a spring, or the like is preferably effective for direct thermal coupling. However, there is not necessarily a need for strong swaging in consideration of the low thermal resistance achieved under a low pressure, and the decreased pressure dependency of the thermal resistance, which are a characteristic feature of the present invention. Even when the swaging pressure changes, the influence thereof is small, so that a practically extremely effective interface thermal coupling can be realized. When a pressure is applied with a mechanical pressure or the like, the pressure may be, for example, 0.1 MPa or more, preferably 0.2 MPa or more. An upper limit of the pressure is not particularly limited; however, the pressure is preferably 1 MPa or less, more preferably 0.8 MPa or less, because the effect is saturated when the pressure is too large, and also the TIM material may break by excessive pressure. By thermal coupling using such a method, the thermal resistance on a load of 0.2 MPa can be made to be 1.0° C.·cm$^2$/W or less. Also, the ratio ($R_{0.1}/R_{0.5}$) of the thermal resistance ($R_{0.1}$) on a load of 0.1 MPa to the thermal resistance ($R_{0.5}$) on a load of 0.5 MPa can be made to be 1.0 to 3.0. Further, for example, in a durability test (in air) for 240 hours at 150° C., thermal coupling in which the thermal coupling properties thereof change little (that is, the increasing rate of the thermal resistance which is represented by the amount of change in the thermal resistance before and after the durability test relative to the thermal resistance before the durability test is 20% or less) can be made. A thermal coupling method having such an excellent thermostability is not known up till now.

Accordingly, the method for thermally coupling with the thermal interface material of the present invention is particularly excellent in a high-temperature environment. In particular, this is an extremely effective when the temperature of at least one of the thermal coupling materials is 150° C. or higher, and the effectiveness thereof can be exhibited in a LED or a power semiconductor or in a severe environment such as a vicinity of an automobile engine.

The present application claims the benefit of priority to Japanese Patent Application Number 2017-017693 filed on Feb. 2, 2017. The entire contents of the specification of Japanese Patent Application Number 2017-017693 filed on Feb. 2, 2017 are hereby incorporated by reference.

EXAMPLES

Hereinafter, the present invention will be described in detail with reference to Examples, but the present invention is not limited thereto, and the variation and the modification of the present invention without departing the gist described above and below are all included the technical scope of the present invention.
<Measurement Method of Physical Property>
First, a method of measuring the physical properties in the following Examples will be shown in the following.
(1) Thickness of Graphite Film
The thickness at arbitrary five sites of a graphite film cut out to have a size of 50×50 mm$^2$ was measured with a contact-type thickness gauge, and an average value thereof was determined as the thickness of the graphite film.
(2) Density of Graphite Film
The density of the graphite film was measured by using a dry-type automatic density meter AccuPyc II 1340 (manufactured by Shimadzu Corporation). The density was measured sheet by sheet with respect to the five sheets of graphite film cut out to have a 50×50 mm$^2$ shape, and an average value thereof was determined as the density.

(3) Thermal Conductivity of Graphite Film
The thermal diffusion rate was measured by using a thermal diffusion rate measurement apparatus employing the periodic heating method ("LaserPit" apparatus manufactured by ULVAC, Inc.) and using a frequency of 10 Hz at 25° C. in vacuum (about 10$^{-2}$ Pa). This was a method of attaching a thermocouple at a point spaced apart by a certain distance from the point of laser heating and measuring the temperature change thereof. The thermal conductivity (W/mK) was calculated by multiplying the thermal diffusion rate (m$^2$/s), the density (kg/m$^3$), and the specific heat (798 kJ/(kg·K)).
(4) Arithmetic Average Roughness Ra on Surface of Graphite Film
Surface roughness (arithmetic average roughness) Ra of the graphite film at room temperature (20° C.) was measured by using a surface roughness measuring instrument (Surfcom DX manufactured by TOKYO SEIMITSU Co., LTD.) in accordance with JIS B 0601. A sample of a graphite film having a 5 cm×5 cm square size was used to measure the surface roughness. Portions of measuring the surface roughness Ra were five portions shown in line segments of FIG. 1. The reference length L was determined in accordance with JIS B 0633. When a part of the reference length L was cut from the chart drawn at a feed rate of 0.05 mm/sec and the roughness curve was expressed by Y=f(X) regarding the average line of the cut part as the X axis and regarding a longitudinal direction as the Y axis, the arithmetic average roughness Ra was the value obtained by the following formula (2) and expressed in μm. Each of Ra values was measured at five portions of the graphite film (center portions 1β of line segments 1a), and an average value of five Ra values was calculated to obtain the arithmetic average roughness Ra of the graphite film.

[Mathematical Formula 2]

$$R_a = \frac{1}{L}\int_0^L |f(x)|dx \qquad (2)$$

(5) Calculation of Ra/Rave Ratio of Graphite Film
As mentioned above, when the arithmetic average roughness Ra was measured at five portions on the selected graphite film, a ratio of each of the arithmetic average roughnesses Ra to an average value of the arithmetic average roughnesses Ra, that is, a ratio of Ra/Rave was determined to consider this as the uniformity of the wrinkles.
(6) Measurement of Thermal Resistance of Graphite Film
The thermal resistance of the TIM made of the graphite film of the present invention was measured by using a precision thermal resistance measurement apparatus manufactured by Hitachi Technologies and Services, Ltd. The present measurement apparatus was an apparatus capable of measuring a precise thermal resistance, and an error thereof was ±0.002° C.·cm$^2$/W. The sample dimension was 10×10 mm$^2$; the load was 10 to 30 N (corresponding to 0.1 MPa to 0.5 MPa); and the measurement temperature was 60° C. Specifically, first the applied watt number (W) was adjusted so that the interfacial temperature was 60° C., and the measurement was made for 10 times after the temperature change became constant. An average value thereof was determined as the measured value of the thermal resistance.

The above was a standard method of measuring the thermal resistance, and the measurement rod surface of the above thermal resistance measurement apparatus was subjected to mirror surface finishing and was different from the material surface where practical unevenness was present. The value needed in the present invention is a thermal resistance at the interface where unevenness is present, such as shown in FIG. 6. The reference numerals 6a, 6b, and 6c denote the first material, the thermal interface material, and the second material, respectively. As shown below, the thermal resistance measurement between the materials having unevenness was conducted by using the above measurement apparatus.

FIG. 7 shows a method of measuring the thermal resistance when the surface roughness of the material is changed test by test using a material having a surface roughness (a surface unevenness). The reference numerals 7a and 7b denote the measurement rod of the above precision thermal resistance measurement apparatus manufactured by Hitachi Technologies and Services, Ltd. and the silicone grease, respectively. The reference numeral 7c denotes a copper foil having an unevenness of a certain size on one surface. This copper foil was coupled by using the rod 7a and the silicone grease 7b. The reference numeral 7d denotes a graphite film. First, the thermal resistance property was measured while changing the load using copper foils having different surface roughnesses in a state that the graphite film was not interposed. The measurement value of this time was represented as x. The measurement conditions were as described above. Next, the thermal resistance was measured for each case by interposing the graphite film in a manner such as shown in FIG. 7. The measurement value of this time was represented as y. However, the thermal resistances measured by this method were values including the thermal resistances between 7a-7b and between 7b-7c (upper and lower two sites, respectively, with a sum of four sites), and were not values showing only the thermal resistances between 7c-7d-7c to be measured in the present invention. In order to calculate the thermal resistances between 7c-7d-7c, it was necessary to estimate the thermal resistances between 7a-7b and between 7b-7c from the measurement values and to subtract the estimated values from the total measured values. For that purpose, the thermal resistances between 6a-8b and between 8b-8c were measured by a method shown in FIG. 8. The thermal resistances of FIG. 8 were principally the same as the thermal resistances between 7a-7b and between 7b-7c of FIG. 7. The value of this time was represented as z. The value measured by this method was subtracted from the thermal resistance measured by the method of FIG. 7, that is, the value of y−z was regarded as the thermal resistance to be determined. By comparing the value of x−z and the value of y−z, the effect of the TIM made of the graphite film of the present, invention (the effect of the TIM material itself that does not include the thermal resistance at the interface) can be estimated. Such a method involves a certain number of presuppositions and is not a method of directly measuring the thermal resistance of the TIM itself. However, this is a principally correct evaluation and is sufficient for the evaluation of the practical properties of the TIM. Here, in FIG. 8, the reference numerals 8a, 8b, and 8c denote the rod for measuring thermal resistance, the silicone grease, and the copper foil having mirror surface, respectively.

(7) Preparation of Samples Used in Examples and Comparative Examples

Hereafter, a standard method of preparing the graphite films having different: wrinkles and thicknesses used in the Examples and the Comparative Examples is described. Here, the same thickness and firing conditions are represented by the same alphabets (A, B, and so on) and the samples having different wrinkles are represented by the addition of numerals such as A-1, A-2, and so on.

A curing agent made of 20 g of acetic anhydride and 10 g of isoquinoline was mixed with 100 g of a 18 wt % DMF solution of a polyamide acid prepared from pyromellitic acid dianhydride, 4,4'-diaminodiphenyl ether, and p-phenylenediamine (4/3/1 in a molar ratio) and stirred. After defoaming by centrifugal separation, the mixture was cast and applied onto an aluminum foil. The processes from the stirring till the defoaming were carried out while cooling to 0° C. This laminate of the aluminum foil and the polyamide acid solution was heated at 120° C. for 150 seconds, so as to obtain a gel film having a self-supporting property. This gel film was peeled off from the aluminum foil and fixed to a frame. This gel film was heated at 300° C., 400° C., and 500° C. each for 30 seconds, so as to produce polyimide films having an average linear expansion coefficient of $1.6 \times 10^{-5}$ cm/cm/° C. at 100 to 200° C. and a birefringence of 0.14, and having different thicknesses.

The obtained polyimide film was heated up to 1000° C. at a heating rate of 10° C./minute in a nitrogen gas with use of an electric furnace and held at 1000° C. for one hour to perform a preliminary treatment. Next, the obtained carbonized film was interposed between spacers made of a graphite fiber felt with different Ra (Ra of the spacer surface was changed for each experiment), and further, these were placed between graphite blocks subjected to surface polishing and set in a graphite heater furnace. The temperature was raised up to 2900° C. at a heating rate of 20° C./minute, and the maximum temperature was held for 10 minutes. Thereafter, the temperature was lowered at a cooling rate of 40° C./minute. The graphitization treatment was carried out in an argon atmosphere. During this, a load of 50 gf/cm$^2$ was applied to the sample.

Each of thickness, thermal conductivity, density, Ra, and (Ra/Rave) of fourteen graphite films is shown below.

(A-1) thickness: 65 μm, thermal conductivity of film plane direction: 800 W/mK, density: 1.4 g/cm$^3$, Ra: 0.5 μm, (Ra/Rave): 0.5 to 2.0

(B-1) thickness: 48 μm, thermal conductivity of film plane direction: 1000 W/mK, density: 1.8 g/cm$^3$, Ra: 8 μm, (Ra/Rave): 0.8 to 1.2

(B-2) thickness: 48 μm, thermal conductivity of film plane direction: 1000 W/mK, density: 1.8 g/cm$^3$, Ra: 1.6 μm, (Ra/Rave): 0.6 to 1.4

(B-3) thickness: 48 μm, thermal conductivity of film plane direction: 1000 W/mK, density: 1.8 g/cm$^3$, Ra: 0.3 μm, (Ra/Rave): 0.9 to 1.1

(C-1) thickness: 20 μm, thermal conductivity of film plane direction: 1300 W/mK, density: 2.0 g/cm$^3$, Ra: 0.2 μm, (Ra/Rave): 0.8 to 1.2

(D-1) thickness: 8.1 μm, thermal conductivity of film plane direction: 1580 W/mK, density: 2.1 g/cm$^3$, Ra: 0.6 μm, (Ra/Rave) 0.9 to 1.1

(E-1) thickness: 5.0 μm, thermal conductivity of film plane direction: 1780 W/mK, density: 2.1 g/cm$^3$, Ra: 0.3 μm, (Ra/Rave) 0.8 to 1.2

(F-1) thickness: 2.2 μm, thermal conductivity of film plane direction: 1800 W/mK, density: 2.2 g/cm$^3$, Ra: 0.4 μm, (Ra/Rave) 0.7 to 1.3

(G-1) thickness: 1.0 μm, thermal conductivity of film plane direction: 1780 W/mK, density: 2.1 g/cm$^3$, Ra: 0.3 μm, (Ra/Rave) 0.5 to 1.6

(G-2) thickness: 1.0 μm, thermal conductivity of film plane direction: 1780 W/mK, density: 2.1 g/cm$^3$, Ra: 2.4 μm, (Ra/Rave) 0.6 to 1.5

(G-3) thickness: 1.0 μm, thermal conductivity of film plane direction: 1780 W/mK, density: 2.1 g/cm³, Ra: 6.3 μm, (Ra/Rave) 0.9 to 1.1
(G-4) thickness: 1.0 μm, thermal conductivity of film plane direction: 1600 W/mK, density: 1.9 g/cm³, Ra: 11 μm, (Ra/Rave): 0.14 to 4.0
(G-5) thickness: 1.0 μm, thermal conductivity of film plane direction: 1600 W/mK, density: 1.9 g/cm³, Ra: 0.03 μm, (Ra/Rave): 0.9 to 1.1
(H-1) thickness: 0.8 μm, thermal conductivity of film plane direction: 1600 W/mK, density: 1.9 g/cm³, Ra: 0.2 μm, (Ra/Rave): 0.9 to 1.1

Examples 1 to 10

Various kinds of samples described above were interposed between three kinds of copper foils having different surface roughnesses, to measure the thermal resistances. The results are shown in Table 1. The thicknesses of the samples (B) to (G) were within the range of the present invention (50 μm to 1 μm), and the thermal conductivity in the graphite film plane direction and the density were all within a range of the conditions that the TIM of the present invention should satisfy. Also, the Ra and the ratio of (Ra/Rave) were within a range of the conditions that the TIM of the present invention should satisfy in a preferable embodiment. The thermal resistances of these samples were 0.4 to 0.9° C.·cm²/W (in the case in which the load was 0.2 MPa), and a low thermal resistance surpassing the property of a conventional TIM was exhibited. Further, the ratio $R_{0.1P}/R_{0.5P}$ of the thermal resistance ($R_{0.1P}$) when a pressure of 0.1 MPa was applied to the thermal resistance ($R_{0.5P}$) when a pressure of 0.5 MPa was applied was extremely small and was within 3.0 times. From this, the TIM made of the graphite film satisfying the conditions of the present invention was extremely effective as a TIM interposed between materials having unevenness.

TABLE 1

| Example | Sample | Surface roughness of material | | Thermal resistance (° C. · cm²/W) | | | Pressure dependency |
| --- | --- | --- | --- | --- | --- | --- | --- |
| | | Ra (μm) | Rz (μm) | 0.1 (MPa) | 0.2 (MPa) | 0.5 (MPa) | ($R_{0.1P}/R_{0.5P}$) |
| 1 | B-1 | 0.26 | 1.94 | 0.98 | 0.89 | 0.50 | 1.96 |
| 2 | B-2 | 0.26 | 1.94 | 0.82 | 0.70 | 0.48 | 1.70 |
| 3 | B-3 | 0.26 | 1.94 | 0.77 | 0.66 | 0.41 | 1.87 |
| 4 | C-1 | 0.26 | 1.94 | 0.58 | 0.51 | 0.44 | 1.31 |
| 5 | D-1 | 0.26 | 1.94 | 0.48 | 0.40 | 0.37 | 1.29 |
| 6 | E-1 | 0.26 | 1.94 | 0.48 | 0.42 | 0.39 | 1.23 |
| 7 | F-1 | 0.20 | 1.13 | 0.44 | 0.40 | 0.38 | 1.15 |
| 8 | G-1 | 0.54 | 2.71 | 0.88 | 0.62 | 0.42 | 2.09 |
| 9 | G-2 | 0.20 | 1.13 | 0.70 | 0.66 | 0.63 | 1.11 |
| 10 | G-3 | 0.54 | 2.71 | 0.80 | 0.60 | 0.37 | 2.16 |

Comparative Examples 1 to 10

Four samples (A-1), (G-4), (G-5), and (H-1) were interposed between materials having different surface roughnesses, and the thermal resistances thereof were measured. The results are shown in Table 2. Among these graphite films, the thicknesses of (A-1) and (H-1) were out of the range of the present invention. In (A-1), with respect to three kinds of materials having different surface roughnesses, thermal resistance properties of 1.0° C.·cm²/W or less could not be achieved in any of the cases. This shows that a preferable thickness of the graphite film of the present invention is 50 μm or less, and this seems to be caused by increase in the bulk thermal resistance cue to presence of an air layer, as resulting from the large thickness and the density of the graphite film. (H-1) had a thickness of 0.8 μm which was out of the range of the present invention. With respect to three kinds of materials having different surface roughnesses, thermal resistance properties of 1.0° C.·cm²/W or less could not be achieved. Also, (G-4) had a large wrinkle, and the uniformity of the wrinkle was also out of a preferable range of the present invention. Further, (G-5) was a mirror surface sample with little wrinkle, and the size of the wrinkle was out of the range of the present invention. In these cases as well, thermal resistance properties of 1.0° C.·cm²/W or less could not be achieved.

TABLE 2

| Comparative Example | Sample | Surface roughness of material | | Thermal resistance (° C. · cm²/W) | | |
| --- | --- | --- | --- | --- | --- | --- |
| | | Ra (μm) | Rz (μm) | 0.1 (MPa) | 0.2 (MPa) | 0.5 (MPa) |
| 1 | A-1 | 0.20 | 1.13 | 1.37 | 1.22 | 1.18 |
| 2 | A-1 | 0.26 | 1.94 | 1.68 | 1.42 | 1.30 |
| 3 | A-1 | 0.54 | 2.71 | 2.72 | 2.03 | 1.31 |
| 4 | G-4 | 0.20 | 1.13 | 2.62 | 2.35 | 2.10 |
| 5 | G-4 | 0.54 | 2.71 | 1.99 | 1.76 | 1.54 |
| 6 | G-5 | 0.20 | 1.16 | 1.45 | 1.33 | 1.28 |
| 7 | G-5 | 0.54 | 2.71 | 2.56 | 1.72 | 1.36 |
| 8 | H-1 | 0.20 | 1.13 | 1.72 | 1.58 | 1.44 |
| 9 | H-1 | 0.26 | 1.94 | 2.72 | 1.93 | 1.38 |
| 10 | H-1 | 0.54 | 2.71 | 3.63 | 2.64 | 1.32 |

Examples 11 to 13, Comparative Examples 11 to 13

Table 3 shows the thermal resistance properties when the unevenness of the materials is extremely large, and shows the results when experiments are conducted using D-1 and B-1 as samples of the present invention. From; these results, by the present invention, the range of the surface roughness of the materials satisfying the thermal resistance of 1.0° C.·cm²/W or less under a load of 0.2 MPa resulted in 5.0 μm; or less in terms of the Ra and 25 μm; or less in terms of the Rz.

TABLE 3

| Example and Comparative Example | Sample | Surface roughness of material | | Thermal resistance (° C. · cm²/W) | | |
|---|---|---|---|---|---|---|
| | | Ra (μm) | Rz (μm) | 0.1 (MPa) | 0.2 (MPa) | 0.5 (MPa) |
| Example 11 | D-1 | 0.12 | 4.8 | 0.55 | 0.50 | 0.46 |
| Example 12 | D-1 | 0.98 | 10.1 | 0.74 | 0.67 | 0.51 |
| Example 13 | D-1 | 3.2 | 14.8 | 1.21 | 0.97 | 0.66 |
| Comparative Example 11 | D-1 | 5.3 | 12.0 | 1.53 | 1.38 | 0.99 |
| Comparative Example 12 | D-1 | 4.0 | 28.0 | 2.51 | 2.00 | 1.82 |
| Comparative Example 13 | B-1 | 5.3 | 12.0 | 1.35 | 1.12 | 0.98 |

Example 14

In the same manner as in the method for preparing the sample (C-1) previously described, three graphite films were prepared by changing the maximum treatment temperature of graphitization. The maximum temperatures of the graphitization treatment were 2700° C., 2400° C., and 2100° C., respectively. At this time, the thermal conductivity in the film plane direction of the graphite film treated at 2700° C. was 1080 W/mK; the sample with 2400° C. treatment had 780 W/mK; and the sample with 2100° C. treatment had 500 W/mK. The thermal resistance properties were measured using these graphite films. Among these, the samples in which the thermal resistance of 1.0° C.·cm²/W or less could be achieved under a load of 0.2 MPa were the sample with 2700° C. treatment and the sample with 2400° C. treatment. In the sample with 2100° C. treatment, the thermal resistance of 1.0° C.·cm²/W or less could not be achieved. From these, the thermal conductivity in the film plane direction must be 500 W/mK or more (particularly, more than 500 W/mK).

Examples 15

Each of fourteen graphite films prepared in the above (A-1) to (H-1) was heated for 240 hours in an environment of 150° C. in air. The thicknesses and the thermal conductivities in the film plane direction, and the surface roughnesses Ra of the graphite film before heating the graphite film and after heating the graphite film were compared. As a result, the thicknesses, the thermal conductivities in the film plane direction, and the surface roughnesses Ra did not change at all. Also, with use of the graphite films before and after the thermal treatment, the thermal resistance properties thereof were measured. As a result, the fluctuation of the thermal resistance properties (the ratio of the amount of change in the thermal resistance before and after the thermal treatment relative to the thermal resistance before the durability test) was within 20%. From these, the TIM made of the graphite film of the present, invention can make the change in the thermal resistance thereof be within 20% in a durability test for 240 hours in an environment of 150° C.

EXPLANATION OF NUMERICAL REFERENCE 1a line segment
1α midpoint of each side
10 midpoint of line segment
1γ centroid
5a graphite film
5b spacer
5c pressing jig
6a first material
6b thermal interface material
6c second material
7a rod for measuring thermal resistance
7b silicone grease
7c copper foil having given unevenness on one plane
7d graphite film
8a rod for measuring thermal resistance
8b silicone grease
8c copper foil having mirror surface

The invention claimed is:

1. A thermal interface material for transferring heat by interposing between two materials,
wherein:
the thermal interface material comprises a graphite film, the graphite film has a thickness of 1 μm to 50 μm, a density of 1.80 g/cm³ to 2.26 g/cm³,
a thermal conductivity of 500 W/mK to 2000 W/mK in a film plane direction,
an arithmetic average roughness Ra of 0.1 μm to 10 μm on a surface of the graphite film, and
a ratio of each of arithmetic average roughnesses Ra on two or more parts of the surface of the graphite film to an average Rave of the arithmetic average roughnesses Ra is 0.2 to 5.0.

2. The thermal interface material according to claim 1, wherein the graphite film has a thickness of 2 μm to 20 μm.

3. The thermal interface material according to claim 1, wherein a ratio of a thermal resistance $R_{0.1}$ on a load of 0.1 MPa to a thermal resistance $R_{0.5}$ on a load of 0.5 MPa of the thermal interface material is 1.0 to 3.0.

4. The thermal interface material according to claim 1, wherein a thermal resistance of the thermal interface material is 1.0° C.·cm²/W or less on a load of 0.2 MPa.

5. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and a thermal resistance of the thermal interface material is 1.0° C.·cm²/W or less on a load of 0.2 MPa.

6. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and a ratio of a thermal resistance $R_{0.1}$ on a load of 0.1 MPa to a thermal resistance $R_{0.5}$ on a load of 0.5 MPa of the thermal interface material is 1.0 to 3.0.

7. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and an increasing rate of the thermal resistance of the thermal interface material is 20% or less relative to the thermal resistance before the durability test when the durability test is carried out at 150° C. for 240 hours under air.

8. A method for preparing the thermal interface material according to claim 1, comprising carbonizing a polymer film to form a carbonized film, and graphitizing the carbonized film to form a graphite film.

9. The method according to claim 8, wherein the polymer film comprises a condensed aromatic polymer.

10. The method according to claim 9, comprising carbonizing and graphitizing the polymer film at a temperature of 2400° C. or more, wherein the polymer film comprises an aromatic polyimide and has a thickness of 1.67 μm to 125 μm.

11. The method according to claim 9, wherein in at least one of the carbonizing step and the graphitizing step, the polymer film, the carbonized film, or the graphite film is supported at multiple points, the polymer film, the carbonized film, or the graphite film is carbonized and/or graphitized while pressing.

12. The method according to claim 9, wherein a spacer is laminated on each plane of the polymer film, the carbonized film, or the graphite film, and a laminate of the spacer and the polymer film, the carbonized film, or the graphite film is carbonized and/or graphitized.

13. The method according to claim 8, comprising carbonizing and graphitizing the polymer film at a temperature of 2400° C. or more, wherein the polymer film comprises an aromatic polyimide and has a thickness of 1.67 μm to 125 μm.

14. The method according to claim 13, wherein a spacer is laminated on each plane of the polymer film, the carbonized film, or the graphite film, and a laminate of the spacer and the polymer film, the carbonized film, or the graphite film is carbonized and/or graphitized.

15. The method according to claim 8, wherein in at least one of the carbonizing step and the graphitizing step, the polymer film, the carbonized film, or the graphite film is supported at multiple points, the polymer film, the carbonized film, or the graphite film is carbonized and/or graphitized while pressing.

16. The method according to claim 8, wherein a spacer is laminated on each plane of the polymer film, the carbonized film, or the graphite film, and a laminate of the spacer and the polymer film, the carbonized film, or the graphite film is carbonized and/or graphitized.

17. The method according to claim 16, wherein the spacer has a surface roughness Ra of 0.1 μm to 10 μm.

18. The method according to claim 16, wherein the spacer comprises a felt composed of a carbon fiber or a graphite fiber.

19. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and a thermal resistance of the thermal interface material is 1.0° C.·cm$^2$/W or less on a load of 0.2 MPa.

20. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and a ratio of a thermal resistance $R_{0.1}$ on a load of 0.1 MPa to a thermal resistance $R_{0.5}$ on a load of 0.5 MPa of the thermal interface material is 1.0 to 3.0.

21. A method for thermally coupling two materials with the thermal interface material according to claim 1, wherein each of the two materials has an arithmetic average roughness Ra of 0.2 μm to 5.0 μm and a ten-points-average roughness Rz of 1.0 μm to 25 μm on a surface of each of the two materials, and an increasing rate of the thermal resistance of the thermal interface material is 20% or less relative to the thermal resistance before the durability test when the durability test is carried out at 150° C. for 240 hours under air.

22. A method for preparing the thermal interface material according to claim 1, comprising carbonizing a polymer film to form a carbonized film, and graphitizing the carbonized film to form a graphite film.

\* \* \* \* \*